United States Patent
Saraswat et al.

(12) 
(10) Patent No.: US 9,195,577 B2
(45) Date of Patent: Nov. 24, 2015

(54) DYNAMIC OPERATIONS FOR 3D STACKED MEMORY USING THERMAL DATA

(75) Inventors: Ruchir Saraswat, Swindon (GB); Matthias Gries, Braunschweig (DE)

(73) Assignee: Intel Corporation, Santa Clara, CA (US)

(*) Notice: Subject to any disclaimer, the term of this patent is extended or adjusted under 35 U.S.C. 154(b) by 204 days.

(21) Appl. No.: 13/995,899

(22) PCT Filed: Sep. 30, 2011

(86) PCT No.: PCT/US2011/054467
§ 371 (c)(1),
(2), (4) Date: Jun. 19, 2013

(87) PCT Pub. No.: WO2013/048518
PCT Pub. Date: Apr. 4, 2013

(65) Prior Publication Data
US 2013/0275665 A1   Oct. 17, 2013

(51) Int. Cl.
G06F 12/00 (2006.01)
G11C 7/04 (2006.01)
G11C 11/406 (2006.01)
G11C 5/02 (2006.01)
G06F 1/20 (2006.01)

(52) U.S. Cl.
CPC ............... *G06F 12/00* (2013.01); *G11C 5/025* (2013.01); *G11C 7/04* (2013.01); *G11C 11/40622* (2013.01); *G11C 11/40626* (2013.01); *G06F 1/206* (2013.01)

(58) Field of Classification Search
CPC ...... G11C 7/00; G11C 7/04; G11C 11/40622; G11C 11/40626; G06F 12/00; G06F 1/206; G06F 11/40615

USPC .......... 711/105, 106, E12.001, 167; 365/212, 365/211
See application file for complete search history.

(56) References Cited

U.S. PATENT DOCUMENTS

| | | | |
|---|---|---|---|
| 7,064,994 B1 | 6/2006 | Wu | |
| 7,200,021 B2 | 4/2007 | Raghuram | |
| 7,248,524 B2 | 7/2007 | Nordal et al. | |
| 8,615,679 B2 * | 12/2013 | Smith et al. | 714/5.1 |
| 2006/0041729 A1 * | 2/2006 | Rider et al. | 711/165 |

(Continued)

FOREIGN PATENT DOCUMENTS

| | | |
|---|---|---|
| CN | 101231879 | 7/2008 |
| JP | 2007-133879 | 5/2007 |

(Continued)

OTHER PUBLICATIONS

International Search Report and Written Opinion from PCT/US2011/054467 mailed Feb. 28, 2012, 10 pages.

(Continued)

*Primary Examiner* — Pierre-Michel Bataille
(74) *Attorney, Agent, or Firm* — Blakely, Sokoloff, Taylor & Zafman LLP

(57) ABSTRACT

Dynamic operations for operations for 3D stacked memory using thermal data. An embodiment of a memory device includes memory having multiple coupled memory elements and multiple thermal sensors, including a first thermal sensor in a first area of the memory stack and a second thermal sensor in a second area of the memory stack. A memory controller is to provide operations to modify thermal conditions of the memory elements based at least in part on thermal information generated by the thermal sensors.

23 Claims, 7 Drawing Sheets

(56) References Cited

U.S. PATENT DOCUMENTS

| | | | |
|---|---|---|---|
| 2006/0085616 A1* | 4/2006 | Zeighami et al. | 711/167 |
| 2006/0111866 A1 | 5/2006 | LeClerg et al. | |
| 2007/0140030 A1* | 6/2007 | Wyatt | 365/212 |
| 2007/0191993 A1 | 8/2007 | Wyatt | |
| 2007/0290333 A1 | 12/2007 | Saini et al. | |
| 2008/0103634 A1 | 5/2008 | Santos | |
| 2008/0120485 A1* | 5/2008 | Rothman et al. | 711/165 |
| 2008/0159038 A1 | 7/2008 | Jeong et al. | |
| 2009/0190427 A1 | 7/2009 | Brittain et al. | |
| 2010/0054067 A1 | 3/2010 | Mitchell, Jr. | |
| 2010/0165692 A1 | 7/2010 | Jeddeloh | |
| 2010/0169585 A1* | 7/2010 | Steinbrecher et al. | 711/154 |
| 2010/0195412 A1* | 8/2010 | Furutani et al. | 365/211 |
| 2012/0249219 A1* | 10/2012 | Shoemaker | 327/512 |

FOREIGN PATENT DOCUMENTS

| | | |
|---|---|---|
| JP | 2007-265393 | 10/2007 |
| JP | 2009-537072 | 10/2009 |
| JP | 2011-095974 | 5/2011 |
| JP | 2011-170943 | 9/2011 |
| WO | WO 2006105549 A1 * | 10/2006 |
| WO | WO 2013095674 A1 * | 6/2013 |

OTHER PUBLICATIONS

Extended European Search Report dated May 7, 2015, in European Patent Application No. 11873201.5, 7 pages.

Non-Final Notice of Reasons for Rejection dated Apr. 7, 2015 (+ English translation), in Japanese Patent Application No. 2014-533284, 9 pages.

Official Communication dated Feb. 25, 2015 (+ English translation), in Taiwan Patent Application No. 101130639, 11 pages.

First Office Action dated Aug. 11, 2015 (+ English summary), in Chinese Patent Application No. 201180074494.2, 21 pages.

* cited by examiner ature gradient. In some
DYNAMIC OPERATIONS FOR 3D STACKED MEMORY USING THERMAL DATA

CROSS-REFERENCE TO RELATED APPLICATION

This application is a national phase of PCT/US2011/054467 filed Sep. 30, 2011, which application is incorporated herein by reference in its entirety.

TECHNICAL FIELD

Embodiments of the invention generally relate to the field of electronic devices and, more particularly, to dynamic operations for 3D stacked memory using thermal data.

BACKGROUND

To provide more dense memory for computing operations, concepts involving memory devices (which may be referred to as 3D stacked memory, or stacked memory) having a plurality of closely coupled memory elements have been developed. A 3D stacked memory may include coupled layers or packages of DRAM (dynamic random-access memory) memory elements, which may be referred to as a memory stack. Stacked memory may be utilized to provide a great amount of computer memory in a single device or package, where the device or package may also include certain system components, such as a memory controller and CPU (central processing unit).

Among other issues concerning stacked memory, 3D stacked memories have, by their nature, a complex thermal signature, with increasing size of memory stack resulting in additional thermal challenges. The inner part of a 3D memory stack will generally be hotter than the outer portions since only the outer portions are exposed to cooling, and a larger stack will generally result in a higher temperature difference between the inner and outer portions.

As a result, achieving efficient and effective cooling of stacked memories may be difficult. For example, if the cooling of a 3D stacked memory is dimensioned for a worst-case scenario for reducing hot spots in the memory, as is common in conventional memories then the cooling will generally be over-engineered, resulting in inefficiency in design and construction of the memory stack.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Embodiments of the invention are generally directed to dynamic operations for 3D stacked memory using thermal data.

As used herein:

"3D stacked memory" (where 3D indicates three-dimensional) or "stacked memory" means a computer memory including multiple coupled memory layers, memory packages, or other memory elements. The memory may be vertically stacked or horizontally (such as side by side) stacked, or otherwise contain memory elements that are coupled together. In particular, a stacked memory DRAM device or system may include a memory device having a plurality of DRAM layers. A stacked memory device may also include system elements in the device, such as a CPU (central processing unit), a memory controller, and other related system elements.

In some embodiments, an apparatus, system, or method provides dynamic operations for stacked memory using thermal data to address thermal imbalances in the stacked memory. In some embodiments, a memory device includes thermal sensors for the gathering of thermal information, together with thermal control to respond to heating imbalances. In some embodiments, the dynamic operations for a stacked memory include modifications in data storage and refresh cycling to address heating in various portions of the stacked memory.

Figure 1:
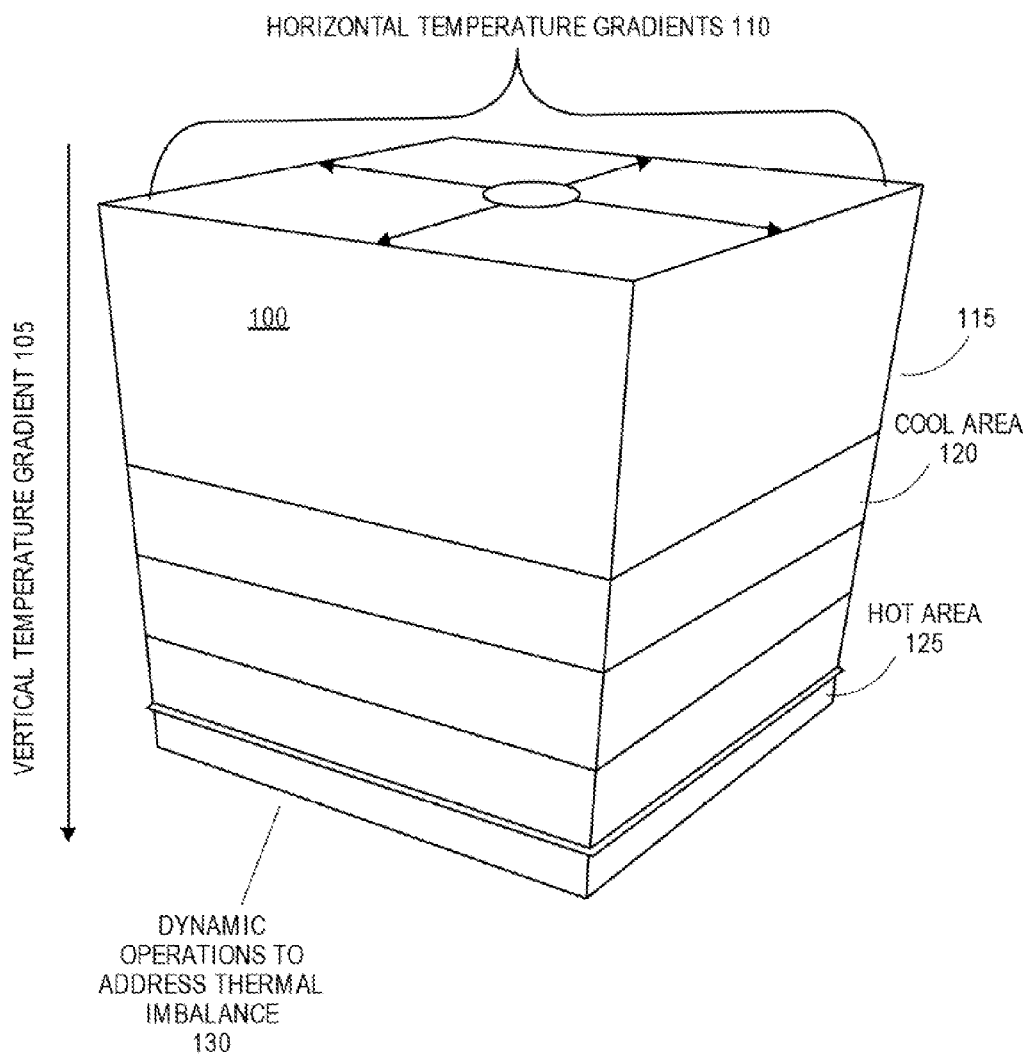
FIG. 1 illustrates an embodiment of a 3D stacked memory.

FIG. 1 illustrates an embodiment of a 3D stacked memory. In this illustration, a 3D stacked memory 100 in operation will generate a vertical temperature gradient 105, with, for example, cooler areas 120 being generally close to the heat sink 115 and hot areas 125 being further from the heat sink. In addition, the stacked memory will further generate horizontal temperature gradients 110, with cooler areas generally being closer to the outside of the memory stack 100. However, the operation of the stacked memory generates heat in active areas, thus creating additional heating imbalances in the stacked memory device. As a result, the structure of warmer and cooler locations in the stacked memory may be complex, and may change constantly during operation.

A thermal gradient, where certain areas may be significantly hotter than others, leads to mechanical stress and accelerated wear out of all components of the stacked memory. For this reason, sufficient cooling of the memory stack 100 is required. However, in attempting to improve the thermal behavior of a memory stack, it is important not to further aggravate the non-uniform temperature gradient. In some embodiments, an apparatus provides for dynamic operations 130 to address thermal imbalances. In some embodiments, the operations further act to recover bandwidth for purposes of transferring data rather than unnecessarily refreshing all portions of the 3D memory stack.

As described herein, a portion of memory that exceeds a thermal budget, is above a certain temperature, is hotter in comparison with one or more other portions of memory, or is otherwise hotter than desired for operation may in general be referred to having excess heat.

In some embodiments, an apparatus, process, and system provide for:

(1) Memory controller and frequency scaling operations to improve thermal imbalance and reduce hot spots in the stacked memory device.

(2) A refresh mechanism that exploits the variability in temperature by independently adapting the refresh rate locally for portions of memory, thus providing necessary refresh cycles while freeing bandwidth for data transfers.

In some embodiments, an apparatus, system, or method operates to use an interface with a memory stack in a thermally efficient manner intended to prevent aggravation of temperature imbalances. A conventional planar RAM (without layers or other closely coupled memory elements, as opposed to a 3D stacked memory) interface does not take into consideration the thermal gradients because the temperature variation across a DIMM (dual in-line memory module), or other similar memory device, is very small. However, as the stacks grow the memory in three dimensions, this is no longer true, and thus it is important for the memory controller to address the stack temperature gradients.

In addition to other effects of excess heat in a computer memory device, more frequent refresh operations are required to maintain data storage as memory elements are heated to higher temperatures. In the case of a stacked DRAM, a constant, worst case-based refresh rate to address the needs of the hottest memory elements (as is commonly used in conventional planar DRAM's) would lead to over-refreshing the cooler parts in a 3D memory stack, thus leading to waste of the available data bandwidth. In addition, the speed bin (which is the manufacturer established operating frequency and voltage for a particular memory) of the memory stack will necessarily be limited by the worst-case temperature at any location in the stack. In some embodiments, an apparatus, system, or method provides dynamic operations to generate a more balanced thermal setup in a 3D stacked memory, thereby resulting to a more efficient operating point for the stacked memory.

Figure 2:
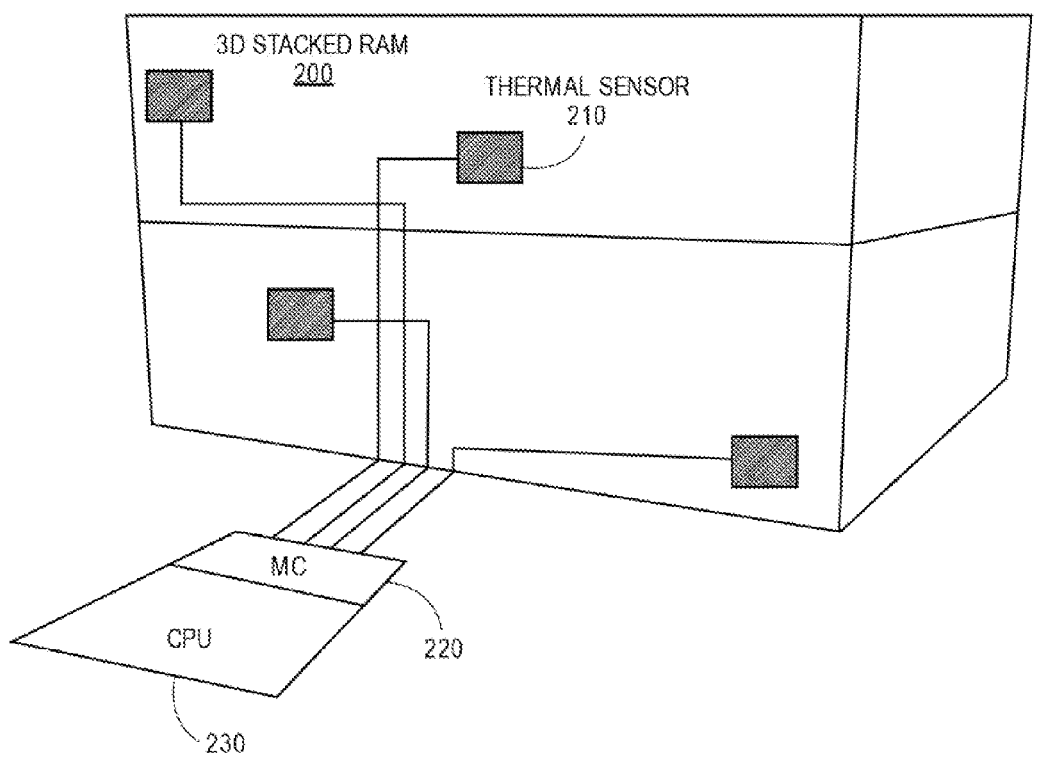
FIG. 2 illustrates an embodiment of a memory device utilizing thermal sensor input to provide stack operation.

FIG. 2 illustrates an embodiment of a memory device utilizing thermal sensor input to provide stack operation. In some embodiments, a 3D stacked device 200, such as memory device having multiple DRAM layers or memory packages, includes a plurality of thermal sensors 210 located in multiple different locations in the memory stack. In some embodiments, the thermal sensors 210 may be placed in locations to provide analysis of the thermal conditions throughout the device 200, including the location of thermal sensors on separate layers and in different portions of layers to provide a large amount of useful data regarding the thermal condition of the device 200. As illustrated, a system further includes a CPU 230 and a memory controller 220. In some implementations, the CPU 230 and memory controller 220, or both, may form a part of the stacked memory device 200. In other implementations, the CPU and memory controller are external to the stacked memory device 200.

In some embodiments, an apparatus, method, and system provides for monitoring the thermal gradients in a 3D stacked memory device, such as memory device 200, generating thermal information based on the thermal monitoring, and utilizing the generated thermal information to provide for a thermally efficient memory stack operation. In some embodiments, an apparatus, method, and system includes dynamic operations to address excess heat in the memory device, wherein the operations data address mapping to reduce access to portions of the memory having excess heat, including limiting access to copies of data in cooler areas or remapping data to cooler areas of memory, and recovering bandwidth for data transfer by adjusting the refresh rate independently for different portions of the 3D memory stack to address thermal imbalances in the memory stack.

In some embodiments, thermal sensors 210 are placed in the 3D stack to monitor the operating temperature of the stack and provide thermal information. In some embodiments, the placement of the thermal sensors is determined by the known thermal behavior of the memory stack itself, and by the power budget available for the sensors. In some embodiments, based at least in part on collected thermal data, which provides temperature readings at various locations in the memory stack, memory controller logic makes decisions regarding the refresh and address mapping of the memory stack.

In some embodiments, a thermal power budget for a stacked memory device, which describes acceptable thermal conditions, is more efficiently utilized by relating the address mapping of the stack to the thermal gradients of the stack. In some embodiments, the bandwidth for the stacked memory device is recovered by changing the refresh rate in the 3D stacked memory dynamically. In some embodiments, the memory module is made more robust to the operating conditions because the refresh rate would otherwise be throttled up in case of extreme operating conditions.

Because an advanced 3D memory stack may be expected to provide bandwidths in the range of Tb/s (terabits per second), the thermal conditions of the memory stack are very dependent on the frequency of operation and the activity factor, wherein the activity factor describes the number of memory accesses issued to a particular area in the memory stack. In some embodiments, a memory stack device may utilize a thermally based reduction of the activity and a complementary address mapping mechanism to provide a reduced activity for hot areas in the memory stack, thus resulting in improved thermal conditions. In some embodiments, a memory controller operates to place higher activity to, for example, areas nearer the surface of the stacked memory device or other locations having lower thermal resistance.

Figure 3:
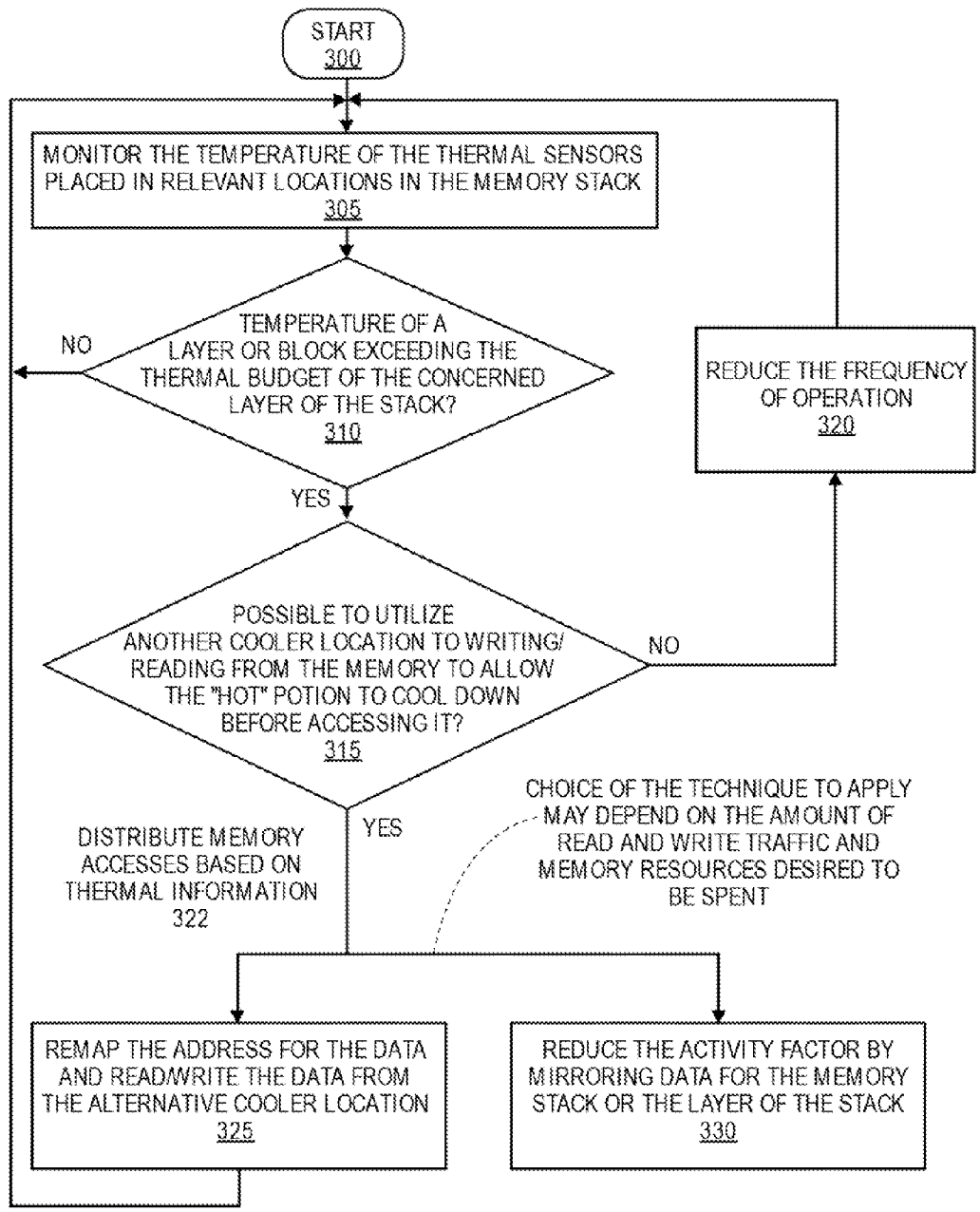
FIG. 3 is a flow chart to illustrate an embodiment of a process for throttling memory operation utilizing thermal information.
Figure 6:
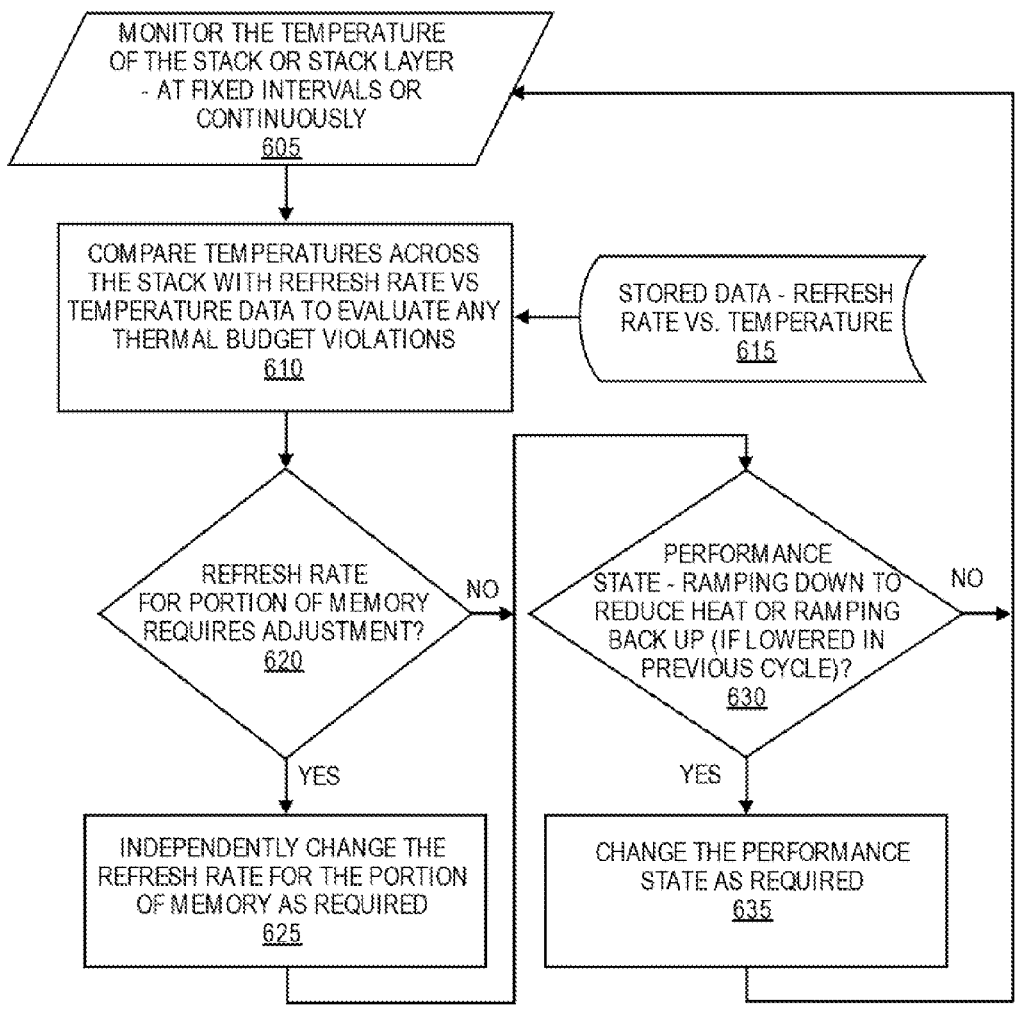
FIG. 6 is a flowchart to illustrate an embodiment of a process for dynamic refresh and performance throttling using thermal gradient data.

FIG. 3 is a flowchart to illustrate an embodiment of a process for throttling memory operation utilizing thermal information. In this illustration, after the start of operations of a memory stack device 300, the memory device monitors the temperature of thermal sensors that are placed in relevant locations in the memory stack 305. In some embodiments, if a temperature of a layer or block of the memory exceeds a thermal budget, such as a thermal budget for the layer or the memory stack 310, and if it is possible to use another cooler location in the memory stack to allow the hot portion of memory to cool down before accessing it 315, then the memory stack device will take action to transfer data to address the thermal imbalance 322. In some embodiments, if it is not possible to use another cooler location in the memory stack, then the memory device will reduce the frequency of operation 320, such as illustrated in FIG. 6.

Figure 4:
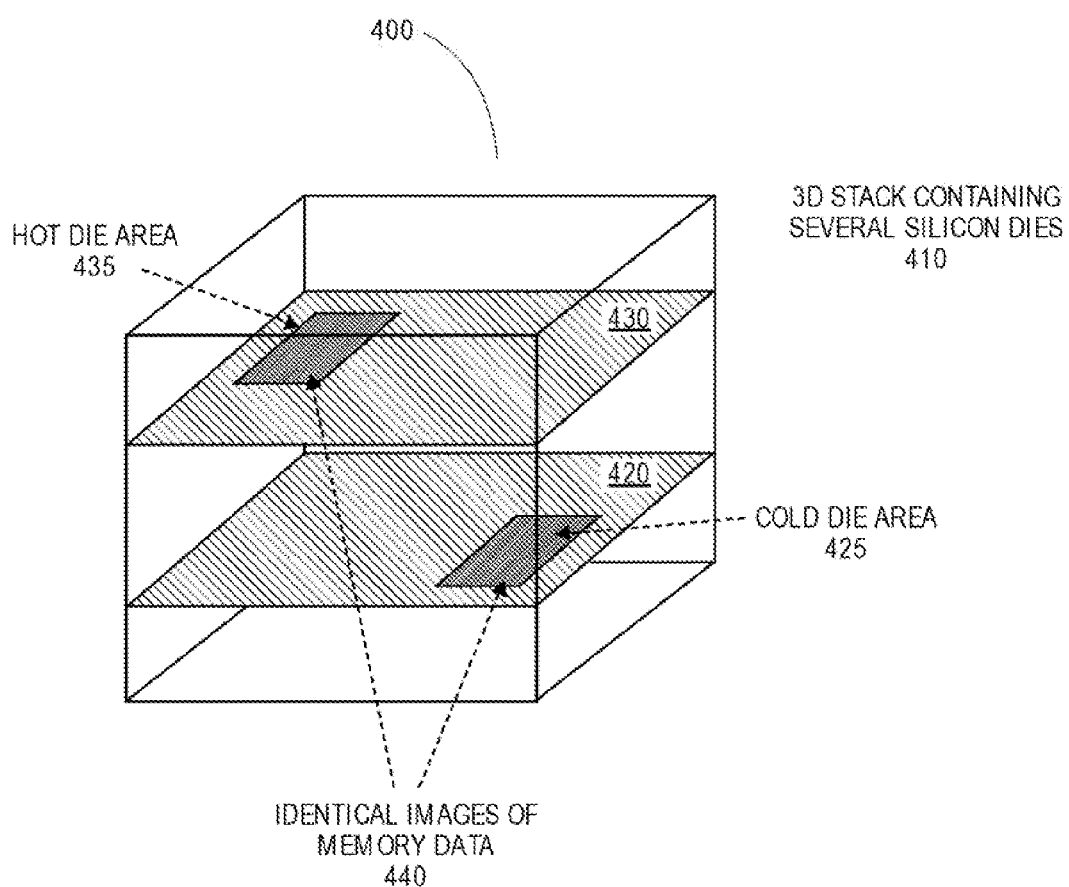
FIG. 4 illustrates an embodiment of a stacked memory utilizing mirroring of data to address thermal issues.
Figure 5:
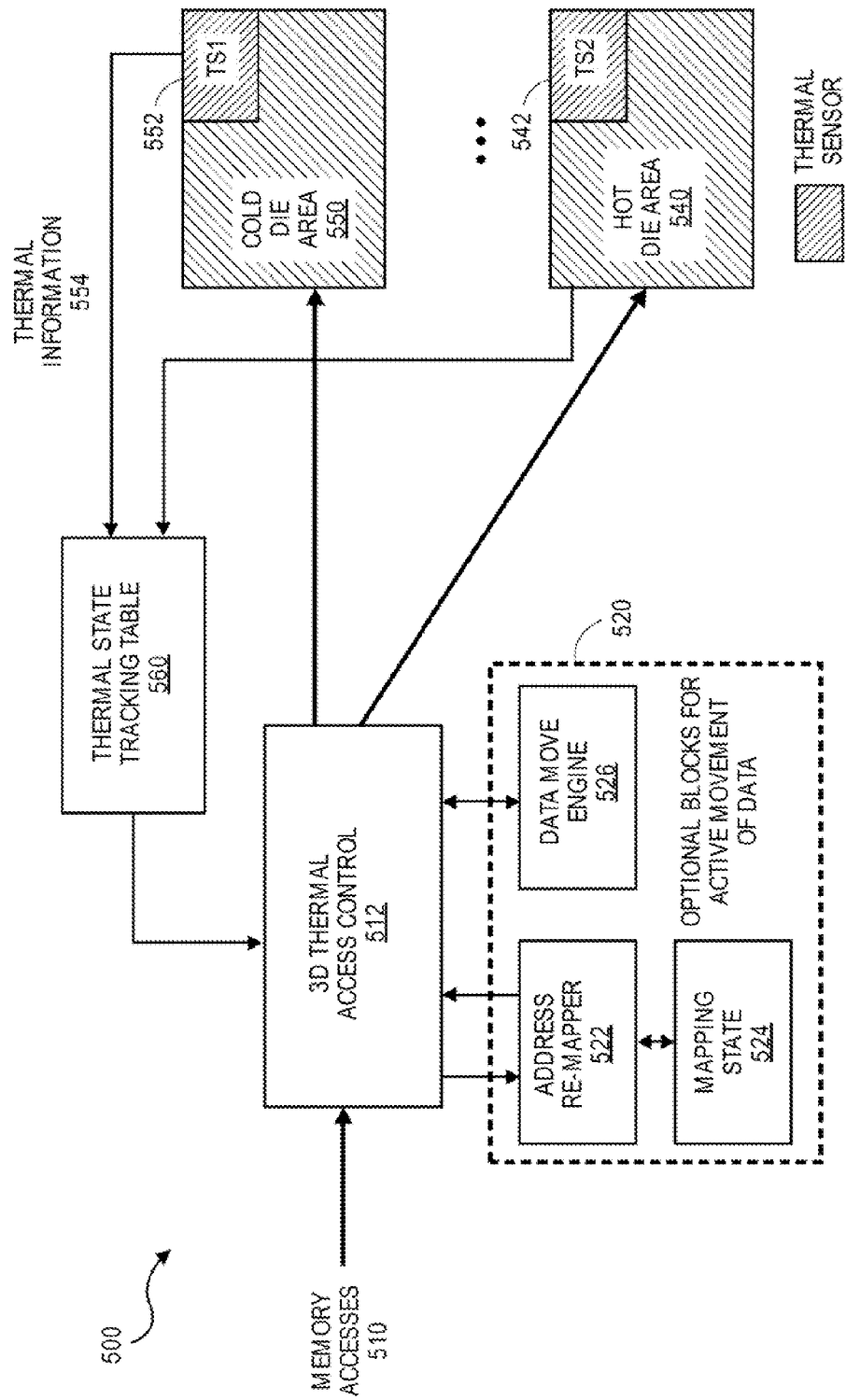
FIG. 5 is a block diagram to illustrate elements of memory controller utilizing thermal data to distribute memory activity by remapping of data.

In some embodiments, the technique to use another cooler location in the memory stack may include either remapping the address for the affected data to the alternative cooler location and reading and writing from this location 325, such as illustrated in FIG. 5, or reducing the activity factor for the hot location by mirroring data in multiple locations and providing reading accesses only to the cooler location 330, such as illustrated in FIG. 4. In some embodiments, a choice between re-mapping and reducing the activity factor may depend at least in part on the amount of read and write traffic for the memory stack (where mirroring does not require transfers of data, which may simplify operation if there is a large number of memory accesses) and the memory resources that are desired need to be spent (where the re-mapping technique may require less memory resources than the mirroring technique).

FIG. 4 illustrates an embodiment of a stacked memory utilizing mirroring of data to address thermal issues. In some embodiments, a stacked memory 400 includes a 3D stack of a plurality of silicon memory dies 410, including, for example, a first die layer 420 and a second die layer 430. While the die layers are referred to as the first and second die layers, this is not necessarily indicative of the actual position in the memory stack of the die layers. For example, the die layers may be located anywhere in the memory stack, the first die layer may be above or below the second die layer, and the first and second die layers may be adjacent to each other or there may be any number of die layers between the first and second die layers. In some embodiments, the memory 400 includes a mechanism to reduce the activity in a hot region of the stack utilizing data mirroring. In some embodiments, operations may be directed by a memory controller, such as memory controller 220 illustrated in FIG. 2, where the memory controller may be a part of the stacked memory 400.

In some embodiments, multiple identical images of memory data 440 are maintained on the same die or on different dies within the memory stack. In this illustration, a first image of the memory data is maintained in a first die area 425 on the first die 420 and in a second die area 435 on the second die 430 (where such areas could also be on the same die). While the illustration provides two mirrored images, the number of mirrored images may be any number of two or more. In this example, at a point in time, the first die area 425 is a "cold" die area and the second die area is a "hot" die area, which may be referred as having excess heat. This indicates that the first die area 425 at a point in time has a relatively low temperature and the second die area 435 has a relatively high temperature. However, the identity of the "cold" die area and "hot" die area can switch over time as the temperatures change, such as changes that occur as a result of activity in the memory device.

In some embodiments, write transactions are issued to each of the multiple mirrored images in order to maintain consistent mirrored copies. In some embodiments, with read transactions are served from less than all mirrored images, such as, for example, only from the mirrored image on the mirrored die area having with the coldest temperature (in this illustration the first "cold" die area 425), thus reducing the thermal pressure on the other mirrored images. In this manner, a mechanism is provided where the position of data does not need to be tracked, with address remapping not occurring. However, the amount of available memory space in the memory device or system 400 is reduced because identical data images are required to be maintained in multiple locations of the memory.

In some embodiments, a different technique is provided for utilizing thermal information in a stacked memory, where data is re-mapped from warmer to cooler memory locations. In some embodiments, a device or system provides for tracking the position of data on a natural structural granularity, such as pages, memory banks or whole dies, and providing for actively moving data from a hot region to a cold region. FIG. 5 is a block diagram to illustrate elements of memory controller utilizing thermal data to distribute memory activity by remapping of data. In some embodiments, a memory controller of a memory device or system includes a 3D thermal access control 512, which receives memory accesses 510. In some embodiments, the memory controller may include logic to receive thermal information from a plurality of thermal sensors and logic to modify the thermal conditions of the memory elements based at least in part on the thermal information. In some embodiments, logic of the memory controller 500 includes an additional address mapping layer 520, the address mapping layer 520 including an address re-mapper element 522 (to re-map addresses) and a mapping state element 524 (to maintain the state of address mapping), to map incoming address transactions from an old position in the stack to a new position.

In some embodiments, the 3D thermal access control 512 accesses data from a thermal state tracking table 560, where the table 560 includes thermal information 554 from a plurality of thermal sensors that are distributed on dies of the memory apparatus or system 500. For example, a first thermal sensor (TS1) 552 is located in a first "cold" die area 550 and a second thermal sensor (TS2) 542 is located on a second "hot" die area 540. In some embodiments, the thermal access control 512 utilizes the thermal data to transfer data based on the thermal state tracking table, such as transferring data from the hot die area 540 to the cold die area 550, where the cold die area 550 is a spare memory area that is available for data transfer.

In some embodiments, the memory controller 500 moves data in the background of operation, where the memory controller may exploit unused bandwidth, or may be triggered based on the granularity of transactions and appear on-the-fly. In some embodiments, a dedicated management engine is utilized to track the state of these data movements, the engine referred to herein as a data move engine 526.

In some embodiments, the memory tracking mode of operation illustrated in FIG. 5 requires a certain amount of spare memory area, which is required to be a relatively "cold" memory area, for intermediate storage of data, but this overhead would be smaller than required for a mirroring mode, such as illustrated in FIG. 4, where identical data is stored in at least two locations.

In some embodiments, the 3D thermal access control (which may be at least a part of a central control block for the memory) is responsible for distributing accesses to colder memory areas in order to cool down hotter areas. In some embodiments, the thermal access control may further operate to throttle the amount of accesses issued to hot areas in the stack. In some embodiments, scheduling and queuing stages in the memory controller are thus augmented with thermal information to either statically or dynamically determine scheduling priorities for individual memory accesses or classes of memory accesses.

In some embodiments, an apparatus, system, or method provides for a dynamic refresh and frequency throttling mechanism. Because of the varying thermal gradients in 3D stacked memory, providing a constant refresh rate for the stack is inefficient. For example, a worst case refresh rate based on the hottest DRAM die or memory region would consume significant bandwidth for purposes of accessing a colder DRAM die due to over refreshing.

FIG. 6 is a flow chart to illustrate an embodiment of a process for dynamic refresh and performance throttling using thermal gradient data. In some embodiments, temperatures of locations in a memory stack are monitored, wherein the monitoring is provided by a plurality of thermal sensors provided in various locations in the memory stack 605. In some embodiments, the temperatures across the memory stack are compared with a table providing refresh rates versus temperature values 615 to evaluate any thermal budget violations 610.

In some embodiments, determinations are made regarding whether the refresh rate for any memory block (or other portion of memory) requires adjustment 620, resulting in an independent change in refresh rate for the memory block or other portion of memory as required 625, and whether a performance state needs to be ramped down (decreased) to reduce heat or may be ramped back up (increased) (if the performance state was lowered in a previous cycle) 630, resulting in a change of performance state as required 635. In some embodiments, a performance state is a state of the memory stack that affects the performance of the memory. Performance states may include, but are not limited to:

(1) A rate of access for reading and writing access of all or part of a memory device. For example, in a highest performance state, the memory may provide a read or write access for each clock cycle (or other maximum access rate). In some embodiments, an apparatus, system, or method may include changing the access rate of all or a part of a stacked memory device to a lower rate, such as by skipping one or more clock cycles between read or write accesses, thus reducing generated heat for the memory elements being accessed.

(2) A clock frequency of all or part of the memory device. For example, a change of performance state may include changing the clock frequency of all or a part a memory device to a lower clock frequency, thereby reducing speed of operations and resulting heat in the memory device.

(3) A voltage of all or part of the memory device. For example, a change of performance state for a memory device that is operable to run in a range of source voltages may include reducing the source voltage for all or part of the memory device, where the reduction in voltage will generally result in reduced memory performance but also reduced generated heat.

While for simplicity of illustration the determinations and resulting actions regarding refresh time 620 and performance state 630 are shown in sequence, embodiments are not limited to any particular order of such operations. Such determinations and actions may be made in any order, or may be performed in parallel.

Figure 7:
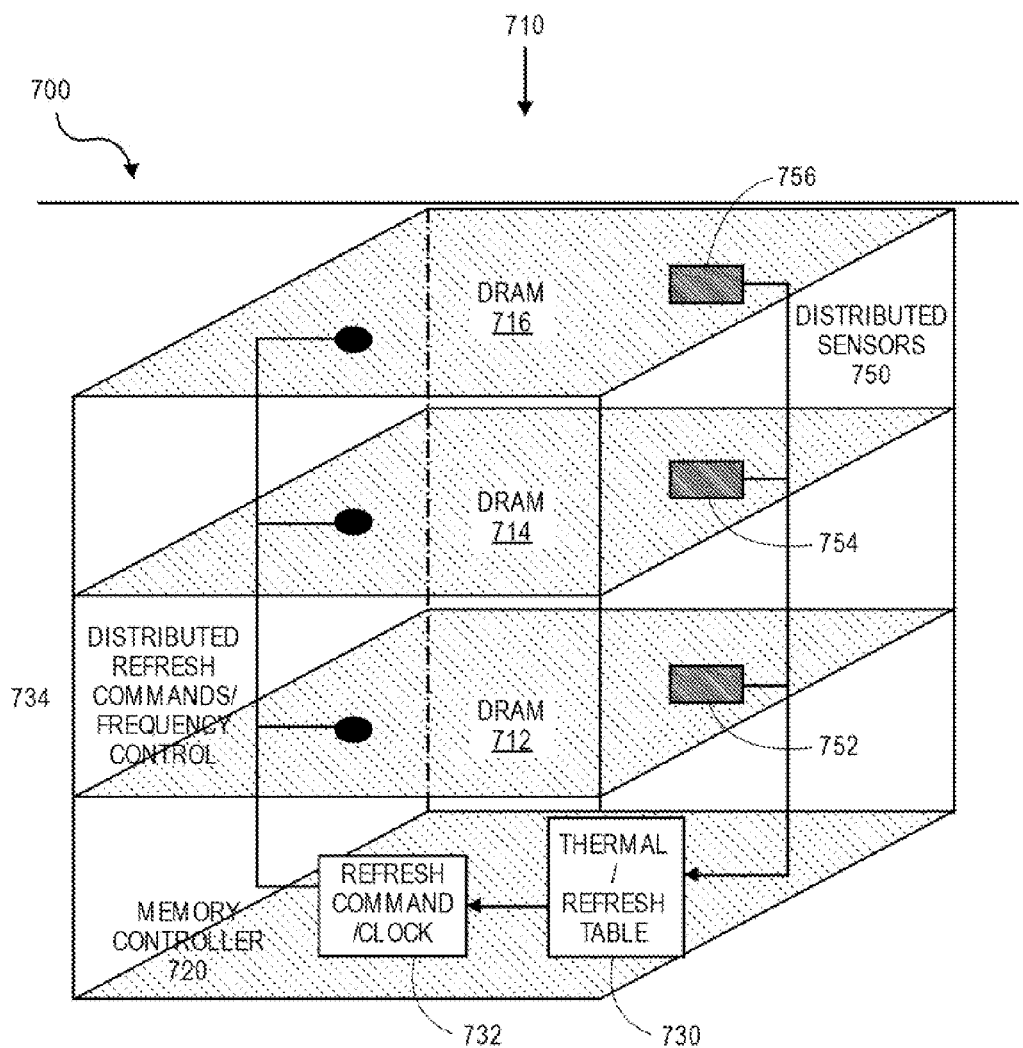
FIG. 7 is a block diagram to illustrate an embodiment of thermal based performance throttling and refresh control.

FIG. 7 is a block diagram to illustrate an embodiment of thermal based frequency throttling and refresh control. In some embodiments, a stacked memory device 700 with memory controller 720 including a plurality of DRAM die layers 710 includes thermal sensors placed across multiple dies. As depicted in FIG. 7, a stacked memory device 700 includes distributed thermal sensors 750 across multiple dies, shown here as a first thermal sensor 752 on a first DRAM die 712, a second thermal sensor 754 on a second DRAM die 714, and a third thermal sensor 756 on a third DRAM die 716. However, embodiments are not limited to this structure, and may include implementations in which not every die includes a thermal sensor, and in which certain dies includes multiple thermal sensors.

In some embodiments, the thermal sensors 750 measure, either continuously or in discrete fashion, the temperatures of various layers of the memory device 700. In some embodiments, the memory controller 720 provides for comparing the temperature of the various layers to a previously characterized refresh rate for a temperature range in a thermal based refresh table 730. In some embodiments, the memory controller 720 determines a corresponding refresh cycle based upon the thermal refresh table 730, and generates refresh commands 732, where such commands are distributed refresh commands 734 for different portions of the memory device based upon the thermal characteristics shown by the outputs of the thermal sensors.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form. There may be intermediate structure between illustrated components. The components described or illustrated herein may have additional inputs or outputs which are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, floppy diskettes, optical disks, compact disk read-only memory (CD-ROM), and magneto-optical disks, read-only memory (ROM), random access memory (RAM), erasable programmable read-only memory (EPROM), electrically-erasable programmable read-only memory (EEPROM), magnet or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present invention. It will be apparent to those skilled in the art that many further modifications and adaptations can be made. The particular embodiments are not provided to limit the invention but to illustrate it. The scope of the embodiments of the present invention is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example of the present invention. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the present invention, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims are hereby expressly incorporated into this description, with each claim standing on its own as a separate embodiment of this invention.

What is claimed is:

1. A memory device comprising:
a memory stack including a plurality of coupled memory elements; and
a plurality of thermal sensors, the plurality of thermal sensors including a first thermal sensor in a first area of memory of the memory stack and a second thermal sensor in a second area of memory of the memory stack;
wherein a memory controller is to provide operations to modify thermal conditions of the plurality of memory elements based at least in part on thermal information generated by the plurality of thermal sensors;
wherein the memory controller is to compare temperatures of the memory to data describing required memory refresh rates for given temperatures, and, wherein if the comparison of the temperatures of the memory to the data indicates that a memory refresh frequency for the first area of memory requires adjustment, the memory controller is to change the memory refresh frequency for the first area of memory, the memory refresh frequency for the first area of memory being adjustable independently from a memory refresh frequency for the second area of memory.

2. The memory device of claim 1, wherein the memory controller is a part of the memory device.

3. The memory device of claim 1, wherein the memory elements include one of a plurality of memory die layers or a plurality of memory packages.

4. The memory device of claim 1, further comprising a thermal state tracking table to store the thermal information.

5. The memory device of claim 1, wherein modification of thermal conditions includes the memory controller to distribute memory accesses based on the thermal information.

6. The memory device of claim 5, wherein the memory controller is to store mirrored copies of data in the first area of memory and the second area of memory, and, upon a determination that the first area of memory has excess heat, the memory controller is to reduce read access to the first area of memory.

7. The memory device of claim 5, wherein the memory controller is to maintain the second area of memory as a spare memory area, and upon a determination that the first area of memory has excess heat, the memory controller is to remap data stored in the first area of memory to the second area of memory.

8. The memory device of claim 5, wherein if it is not possible to distribute memory accesses based on the thermal information to move accesses to a cooler area of the memory stack, the memory controller is to reduce a frequency of operation of the memory device.

9. The memory device of claim 1, wherein the memory controller is to decrease or increase a performance state of the memory device based on the comparison of temperatures of the memory to data describing refresh rates for given temperatures, wherein the performance state is one of a rate of access, a clock frequency, or a voltage of the memory device.

10. The memory device of claim 1, wherein the first area of memory is located in a first memory element, and wherein the second area of memory is located either in the first memory element or in a second memory element.

11. A memory controller comprising:
logic to receive thermal information from a plurality of thermal sensors, the plurality of thermal sensors including a first thermal sensor in a first area of memory of a stacked memory and a second thermal sensor in a second area of memory of the stacked memory, the stacked memory including a plurality of memory elements;
logic to modify the thermal conditions of the memory elements based at least in part on the thermal information; and
logic to compare temperatures of the stacked memory to data describing required memory refresh rates for given temperatures, and, if the comparison of the temperatures of the memory to the data indicates that a memory refresh rate for either the first area of memory or the second area of memory requires adjustment, change the refresh rate for the first area of memory or the second area of memory, wherein the refresh rate for the first area of memory and the refresh rate for the second area of memory are adjusted independently.

12. The memory controller of claim 11, wherein the logic to modify the thermal conditions is to distribute memory accesses based on the thermal information upon a determination that the first area of memory is hotter than the second area of memory.

13. A system comprising:
a memory stack including a plurality of DRAM (dynamic random-access memory) memory die layers;
a memory controller for the memory stack including a thermal access control for the stacked memory;
a thermal state tracking element coupled with the thermal access control; and
a plurality of thermal sensors, the plurality of thermal sensors to provide temperature data to the thermal state tracking element, the plurality of thermal sensors including a first thermal sensor in a first area of memory of the memory stack and a second thermal sensor in a second area of memory of the memory stack;
wherein the memory controller is to utilize the temperature data from the thermal state tracking element to respond to thermal imbalances in the stacked memory;
wherein the memory controller is to compare temperatures of the memory to data describing required memory refresh rates for given temperatures, and, wherein if the comparison of the temperatures of the memory to the data indicates that a memory refresh frequency for the first area of memory requires adjustment, the memory controller is to change the memory refresh frequency for the first area of memory, the memory refresh frequency for the first area of memory being adjustable independently from a memory refresh frequency for the second area of memory.

14. The system of claim 13, wherein the memory controller is to provide data address mapping to reduce access to portions of the memory stack having excess heat, and wherein the address mapping includes one or more of:
limitation of access to copies of data in cooler areas of the memory stack; or
remap of data to cooler areas of the memory stack.

15. The system of claim 13, wherein the memory controller is to adjust a refresh rate independently for different portions of the memory stack to respond to thermal imbalances in the memory stack.

16. The system of claim 13, further comprising an address mapping layer to remap data to respond to the thermal imbalances, the address mapping layer including an address re-mapper element to re-map addresses and a mapping state element to maintain a state of address mapping.

17. The system of claim 13, further comprising a data move engine to track states of data movements to respond to the thermal imbalances in the memory stack.

18. A method comprising:
receiving thermal information from a plurality of thermal sensors, the plurality of thermal sensors including a first thermal sensor in a first area of memory of a stacked memory and a second thermal sensor in a second area of memory of the stacked memory, the stacked memory including a plurality of memory elements;
determining thermal conditions of the stacked memory;
providing an operation to modify the thermal conditions of the memory elements based at least in part on the thermal information; and
comparing temperatures of the stacked memory to data describing required memory refresh rates for given temperatures, and, if the comparison of the temperatures of the memory to the data indicates that a memory refresh rate for either the first area of memory or the second area of memory requires adjustment, changing the refresh rate for the first area of memory or second area of memory, wherein the refresh rate for the first area of memory and the refresh rate for the second area of memory are adjusted independently.

19. The method of claim 18, wherein modifying thermal conditions includes distributing memory accesses based on the thermal information.

20. The method of claim 19, further comprising storing mirrored copies of data in the first area of memory and the second area of memory, upon determining that the first area of memory has excess heat, reducing read access to the mirrored data in the first area of memory.

21. The method of claim 19, further comprising maintaining the second area of memory as a spare memory area, and upon determining that the first area of memory has excess heat, remapping data stored in the first area of memory to the second area of memory.

22. The method of claim 19, wherein, upon determining that it is not possible to distribute memory accesses based on the thermal information to move accesses to a cooler area of memory, further comprising reducing a frequency of operation for the stacked memory.

23. The method of claim 18, further comprising decreasing or increasing a performance state of the stacked memory based on the comparison of temperatures of the stacked memory to the data describing required memory refresh rates for given temperatures.

* * * * *